United States Patent
Yu

(10) Patent No.: US 9,337,424 B2
(45) Date of Patent: May 10, 2016

(54) MAGNETORESISTIVE TUNNEL JUNCTION

(71) Applicant: TAIWAN SEMICONDUCTOR MANUFACTURING COMPANY, LTD., Hsin-Chu (TW)

(72) Inventor: Chwen Yu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 322 days.

(21) Appl. No.: 13/675,344

(22) Filed: Nov. 13, 2012

(65) Prior Publication Data
US 2014/0131652 A1 May 15, 2014

(51) Int. Cl.
*H01L 45/00* (2006.01)
*H01L 43/08* (2006.01)

(52) U.S. Cl.
CPC ............... *H01L 45/16* (2013.01); *H01L 43/08* (2013.01)

(58) Field of Classification Search
CPC ................................ H01L 43/08; H01L 45/16
See application file for complete search history.

(56) References Cited

U.S. PATENT DOCUMENTS

| 8,471,598 B2 | 6/2013 | Yu et al. | |
| 8,477,531 B2 | 7/2013 | Yu et al. | |
| 2010/0188895 A1* | 7/2010 | Lou | 365/171 |
| 2010/0193888 A1* | 8/2010 | Gu et al. | 257/421 |
| 2012/0300543 A1* | 11/2012 | Ohno et al. | 365/171 |

OTHER PUBLICATIONS

Miura et al. "CoFeB/MgO based perpendicular magnetic tunnel junctions with stepped structure for symmetrizing different retention times of "0" and "1" information", pp. 214 and 215, vol. 11B-3, 2011 Symposium on VLSI Technology Digest of Technical Papers.

* cited by examiner

*Primary Examiner* — Caleb Henry
*Assistant Examiner* — Mounir Amer
(74) *Attorney, Agent, or Firm* — Slater & Matsil, L.L.P.

(57) ABSTRACT

A Magnetoresistive Tunnel Junction (MTJ) includes a magnetic reference layer disposed between a first electrode and a resistive layer. The junction also includes a magnetic free layer disposed between the resistive layer and a second electrode. The surface area of the free layer is less than the surface area of the reference layer.

18 Claims, 7 Drawing Sheets

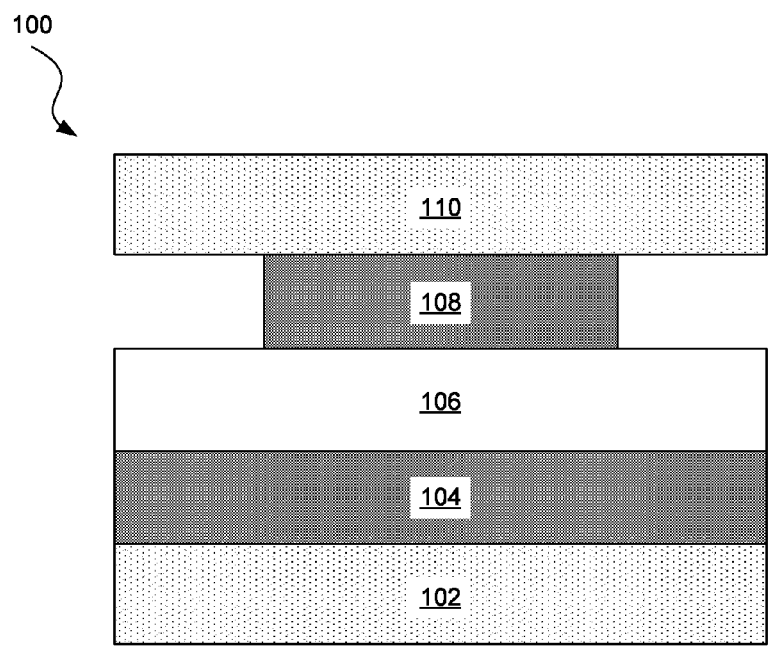
Fig. 1A
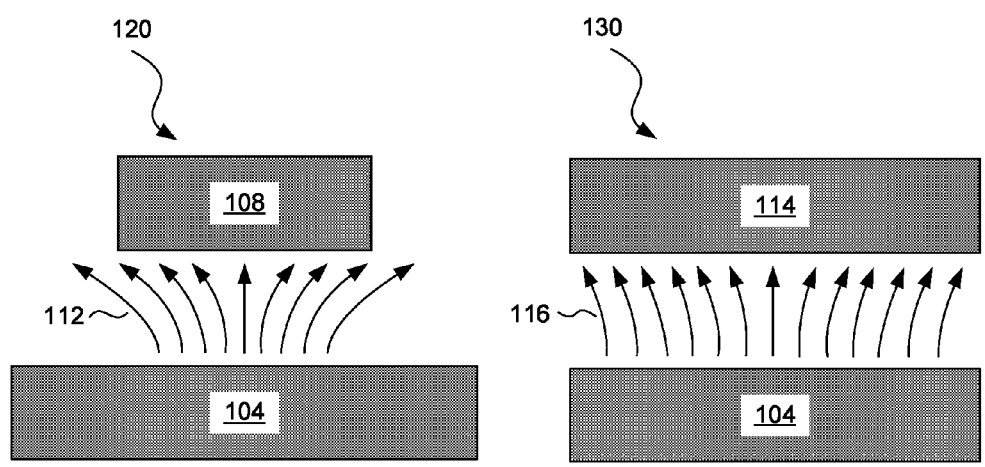
Fig. 1B  Fig. 1C

MAGNETORESISTIVE TUNNEL JUNCTION

BACKGROUND

A Magnetoresistive Tunnel Junction (MTJ) is a device that changes its resistive state based on the state of magnetic materials within the device. An MTJ device includes a thin resistive layer between two ferromagnetic layers. One magnetic layer may be referred to as the reference layer. The other magnetic layer may be referred to as the free layer. The magnetic moment of the reference later generally maintains the same direction. Conversely, through application of a voltage across the junction, the direction of the magnetic moment of the free layer can be reversed. When the direction of the magnetic moment of both the free layer and the reference layer are the same, electrons can more easily tunnel through the thin resistive layer. In this state, the junction has a relatively low resistivity. Through application of a voltage with the opposite polarity, the magnetic moment of the free layer can be switched to oppose the direction of the magnetic moment of the reference layer. In this state, it is more difficult for electrons to tunnel through the resistive layer, causing the junction to have a relatively high resistivity. The different resistive states can be used to store logical values.

Improvements are desired in this field of endeavor. For example, the dipole interaction can be improved between the free and reference layers of the MTJ. Also, it is desired to reduce the density of the device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1A is a diagram showing an illustrative MTJ device, according to one example of principles described herein.

FIG. 1B is a diagram showing the magnetic moment of an MTJ device, according to one example of principles described herein.

FIG. 1C is a diagram showing the magnetic moment of an MTJ device, according to one example of principles described herein.

DETAILED DESCRIPTION

Figure 2A:
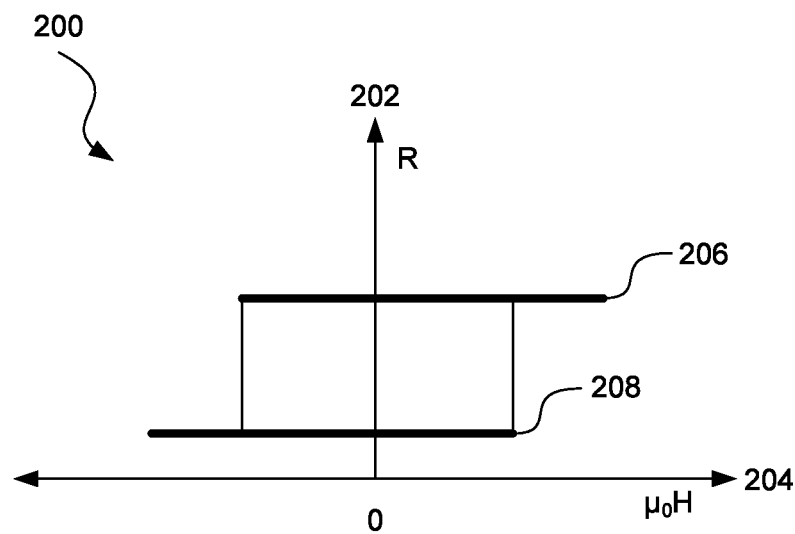
FIG. 2A is a diagram showing an illustrative good hysteresis loop for an MTJ device, according to one example of principles described herein.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1A is a diagram showing an illustrative MTJ device 100. As mentioned above, an MTJ device 100 includes a resistive layer 106 between a magnetic reference layer 104 and a magnetic free layer 108. The reference layer 104 is connected to a first electrode 102 and the free layer 108 is connected to a second electrode 110. The MTJ device 100 may be formed on a semi-conductive substrate and may be formed as part of an integrated circuit.

According to certain illustrative examples, the electrodes may be made of a suitable conductive material. Such materials include, but are not limited to, titanium (Ti), tantalum (Ta), platinum (Pt) or ruthenium (Ru). The electrodes may be formed using a physical vapor deposition (PVD or sputtering) or another suitable process.

The reference layer 104 includes both a pinning layer and a pinned layer. The pinning layer is a layer of anti-ferromagnetic (AFM) material. Anti-ferromagnetic materials are those in which the magnetic moments of atoms or molecules align such that a pattern is formed wherein neighboring atoms or molecules have spins pointing in opposite directions. The pinning layer may be made of a variety of materials, including, but not limited to, platinum manganese (PtMn), iridium manganese (IrMn), rhodium manganese (RhMn) and iron manganese (FeMn).

The pinned layer includes a ferromagnetic layer having a magnetic moment that is "pinned" in a particular direction by the anti-ferromagnetic pinning layer. Thus, the reference layer does not change its magnetic moment during operation of the MTJ device 100. The ferromagnetic layer may be made of a variety of materials, including, but not limited to, CoFeB, CoFeTa, NiFe, Co, CoFe, CoPt, CoPd, FePt, or other alloys of Ni, Co and Fe.

The resistive layer 106 may be formed of an electrically resistive material, such as an oxide material. For example, the resistive layer 106 may be made magnesium (Mg), magnesium oxide (MgO), aluminum oxide (AlO), aluminum nitride (AlN), and aluminum oxynitride (AlON). The resistive layer 106 may be formed through suitable deposition methods. The resistive layer 106 may range in thickness from about 5 angstroms to about 15 angstroms.

The free layer 108 is also made of a ferromagnetic material. Unlike the reference layer 104, the magnetic moment direction of the free layer 108 can change under various conditions during operation of the MTJ device 100 because there is no pinning layer adjacent to the free layer 108. When the magnetic moment of the free layer 108 is the same direction as the magnetic moment of the reference layer 104, electrons can tunnel through the resistive layer 106. This causes the resistive layer to be in a relatively low resistive state. Thus, with a properly polarized voltage applied, an electric current can flow across the junction 100 and through the resistive layer 106.

With an oppositely polarized voltage applied, the direction of the magnetic moment of the free layer 108 can be set to oppose the direction of the magnetic moment of the reference layer 104. In this state, it is more difficult for electrons to tunnel through the resistive layer 106. This causes the resistive layer 106 to be in a relatively high resistive state. The different resistive states may be used to represent digital values. For example, the high resistive state may be used to represent a digital '0' while the low resistive state may be used to represent a digital '1'.

According to certain illustrative examples, the surface area of the free layer 108 is smaller than the surface area of the reference layer 104. For example, in the case where the reference layer 104 and free layer 108 are substantially circular in shape, the radius of the free layer 108 can be smaller than the radius of the reference layer 104. This reduces the dipole interaction between the free layer 108 and the reference layer 104.

FIG. 1B is a diagram showing the magnetic moment of an MTJ device 120. Specifically, FIG. 1B illustrates how having a smaller free layer 108 reduces the dipole interaction between the two magnetic layers 104, 108. The arrows 112 indicate the direction of the magnetic field between the free layer 108 and the reference layer 104. A smaller portion of the magnetic field is perpendicular to the plane of the magnetic layers.

FIG. 1C is a diagram showing the magnetic moment of an MTJ device 130 in which the free layer 114 is substantially equal in size to the reference layer 104. If both the free layer 114 and the reference layer 104 were the same size, then a significant portion of the magnetic field would be perpendicular to the plane of the magnetic layers 104, 114. The arrows 116 illustrate the substantially perpendicular magnetic moment.

With a smaller free layer 108 as illustrated in FIG. 1B, a greater portion of the magnetic field is directed parallel to the plane of the magnetic layers 104, 108, which reduces dipole interaction between the magnetic layers 104, 108. The reduced dipole interaction causes the MTJ to exhibit a better hysteresis loop.

Hysteresis is the property of a system in which the output is affected both by the present input and past conditions. If an input to such a system alternately increases and decreases, then the output tends to form a loop. MTJ devices exhibit hysteresis due to the ferromagnetic materials within. Thus, as the voltage across the junction alternates between positive and negative voltages, the output presents as a loop.

FIG. 2A is a diagram showing an illustrative good hysteresis loop 200 for an MTJ device. According to certain illustrative examples, the vertical axis represents resistance while the horizontal axis 204 represents the magnetic moment of the free layer. The loop has both a high resistive state 206, and a low resistive state 208. When the direction of the magnetic moment is negative (opposite the direction of the magnetic moment of the reference layer), then the device will be in a high resistive state 206. The device will remain as such until an applied voltage reverses the direction (to be in parallel to the direction of the magnetic moment of the reference layer), making it positive enough to allow tunneling of electrons, thereby causing a low resistive state 208. The device will also remain in that state until an applied voltage reverses the direction of the magnetic moment enough to inhibit the tunneling of electrons and switch the device back to the high resistive state 206.

Figure 2B:
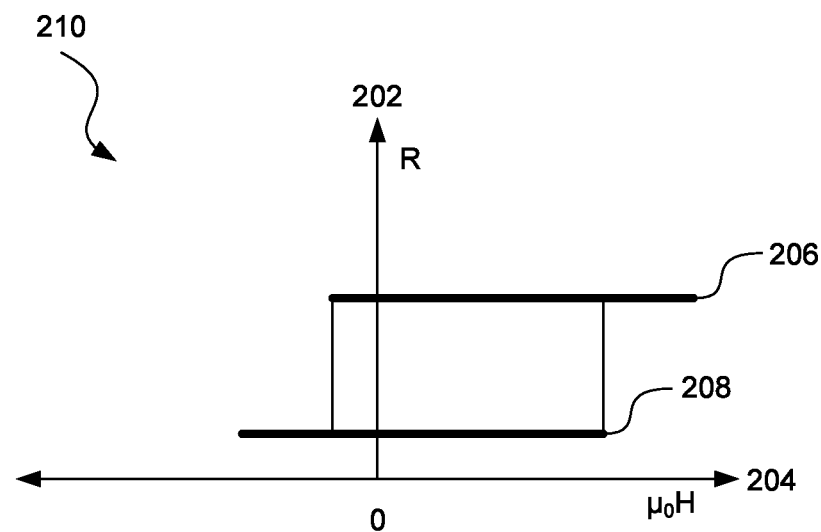
FIG. 2B is a diagram showing an illustrative bad hysteresis loop for an MTJ device, according to one example of principles described herein.

FIG. 2B is a diagram showing an illustrative bad hysteresis loop 210 for an MTJ device. As mentioned above, the dipole interaction between the free layer and the reference layer can adversely affect the hysteresis loop. Particularly, a hysteresis loop that is not centered on zero is a bad hysteresis loop. The bad hysteresis loop adversely affects the switching characteristics of the MTJ device. To avoid these adverse effects, the dipole interaction between the two magnetic layers is reduced. As mentioned above, this may be done by reducing the size of the free layer with respect to the reference layer.

Figure 3:
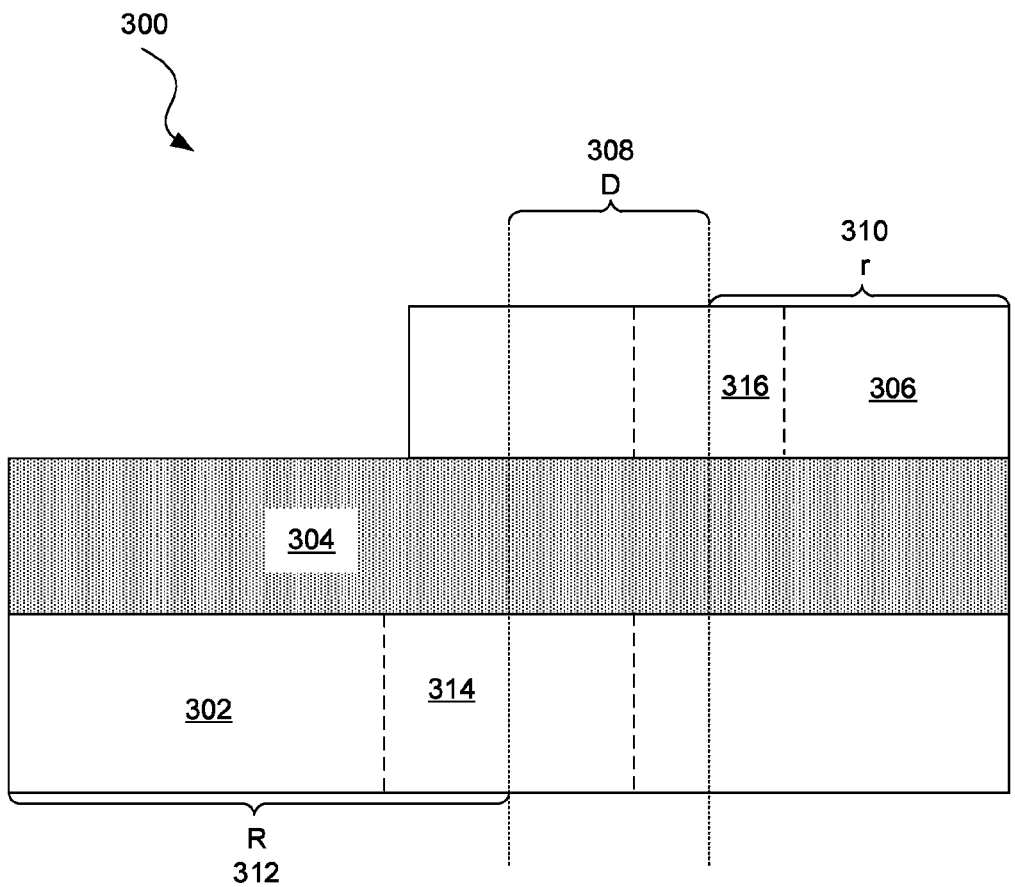
FIG. 3 is a diagram showing an illustrative cross-sectional view of an MTJ device with an offset free layer, according to one example of principles described herein.

FIG. 3 is a diagram showing an illustrative cross-sectional view of an MTJ device 300 with an offset free layer 306. According to certain illustrative examples, the MTJ device 300 includes a resistive layer 304 between a reference layer 302 and a free layer 306.

As mentioned above, the hysteresis loop is improved by reducing the size of the free layer 306 with respect to the reference layer 302. It is also desirable to keep the reference layer 302 as small as possible in order to fit as many MTJ devices within a smaller amount of space. This allows for creating higher density memory modules. But, reducing the size of the reference layer 306 too much results in a smaller free layer 306 to reference layer 302 ratio, which adversely affects the hysteresis loop.

According to certain illustrative examples, the center of the free layer 306 is offset from the center of the reference layer 302. This offset further reduces the dipole interaction between the free layer 306 and the reference layer 302. In turn, the offset allows for a good hysteresis loop while minimizing the overall size of the reference layer 302 and thus allowing for higher density memory modules.

According to one illustrative example, the ratio of the radius 310 of the free layer 310 and the radius 312 of the reference layer is defined as follows:

$$R >= 5r/3 \qquad \text{(Equation 1)}$$

Where:
R is the radius 312 of the reference layer 302; and
r is the radius 310 of the free layer 306.

Additionally, the distance between the center of the reference layer 302 and the center of the free layer 306 may be defined as follows:

$$D >= R/4 + r/4 \qquad \text{(Equation 2)}$$

Where:
- D is the distance 308 between the two centers;
- R is the radius 312 of the reference layer 302; and
- r is the radius 310 of the free layer 306.

With the offset distance 308 defined as such, the magnetic layers 302, 306 will be positioned such that the core of both layers does not overlap. The core of a layer is defined as the area that is within less than ¼ of the radius of that layer. For example, the core 314 of the reference layer 302 is the area within ¼ of the radius of the reference layer 302. Likewise, the core 316 of the free layer is the area within ¼ of the radius 310 of the free layer 306. With the offset distance 308 set as described in Equation 2, the core areas will not overlap. Again, this results in a better hysteresis loop while allowing for a smaller reference layer 302. The smaller reference layer allows for a higher density memory module to be formed.

In some examples, the sizing of the radii 310, 312 of both the reference layer 302 and the free layer 306 can be set to reduce the dipole interaction between the two layers to a predetermined level. This predetermined level may be based on how small the dipole interaction should be in order to achieve a sufficient hysteresis loop. A sufficient hysteresis loop is one that allows the MTJ device 300 to meet certain design criteria like switching capability. Additionally, the offset distance 308 may be adjusted to allow for an array with a predetermined density while still maintaining a sufficient hysteresis loop.

Figure 4:
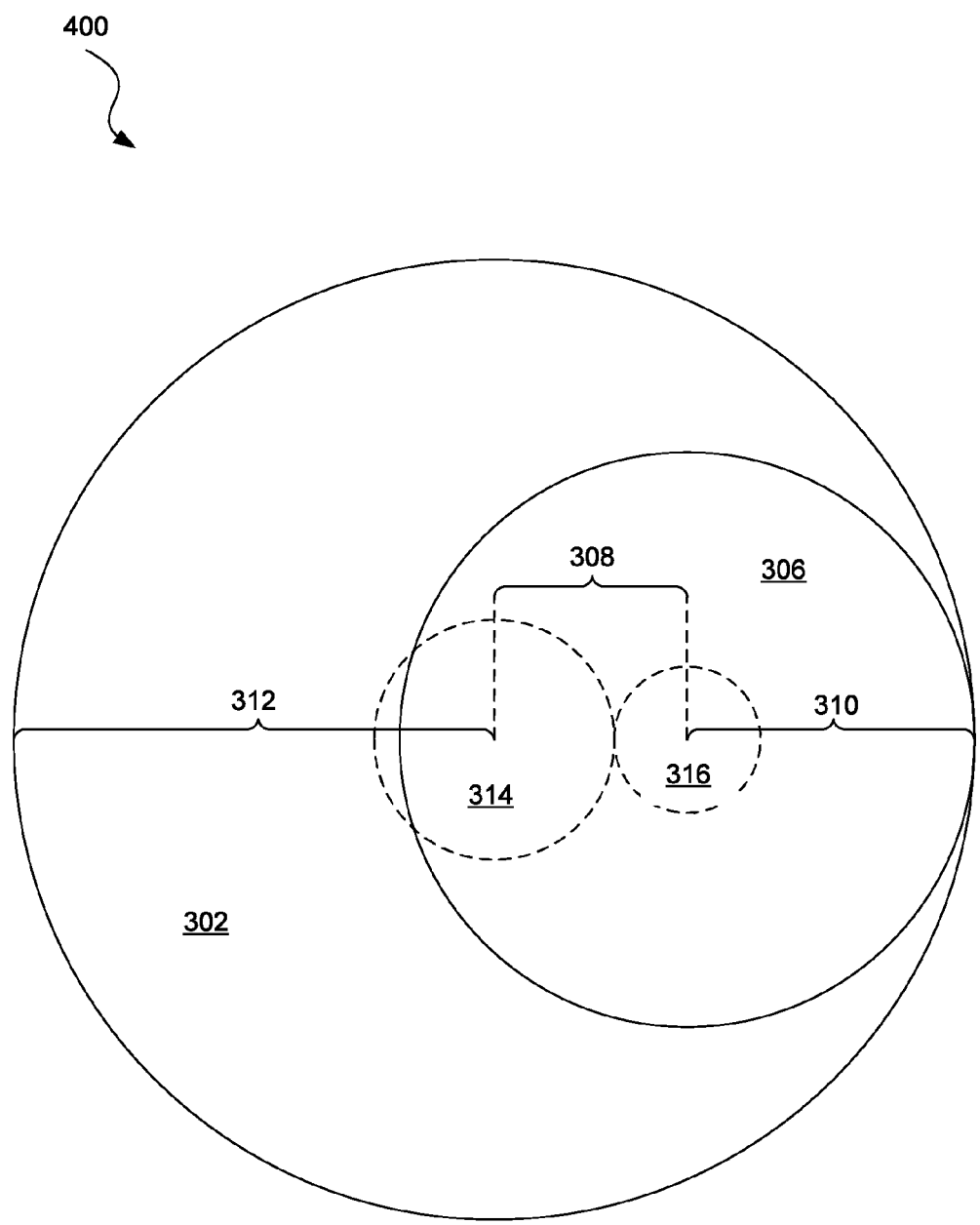
FIG. 4 is a diagram showing an illustrative top view of an MTJ device with an offset free layer, according to one example of principles described herein.

FIG. 4 is a diagram showing an illustrative top view 400 of an MTJ device with an offset free layer 306. FIG. 4 illustrates how the center of the free layer 306 is offset from the center of the reference layer 302 by a specific distance 308. FIG. 4 also illustrates how the distance 308 is such that the core 316 of the free layer 306 does not overlap the core 314 of the reference layer.

Figure 5A:
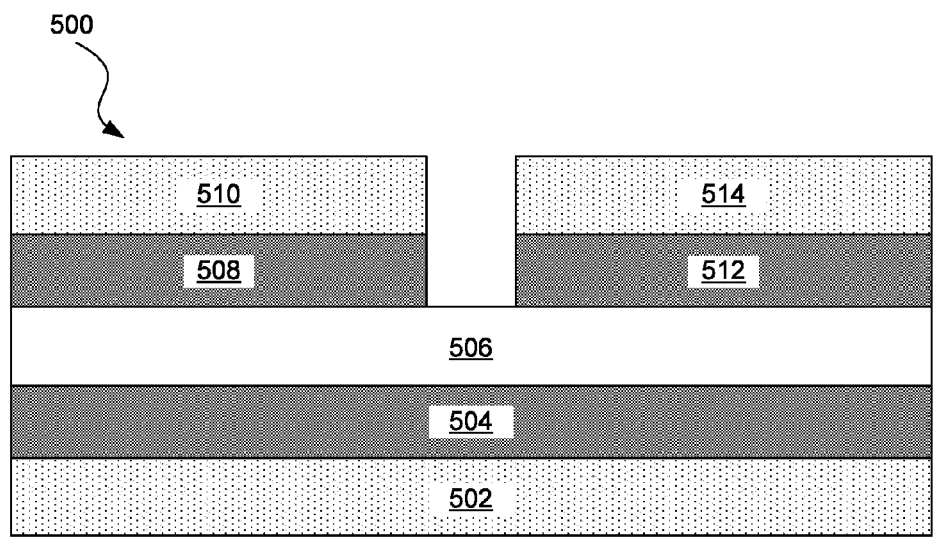
FIG. 5A is a diagram showing an illustrative cross-sectional view of an MTJ device with multiple free layers, according to one example of principles described herein.

FIG. 5A is a diagram showing an illustrative cross-sectional view of an MTJ device with multiple free layers 508, 512. According to certain illustrative examples, an MTJ cell may include more than one free layer per reference layer. For example, the reference layer 504 may be connected to a single electrode 502. Additionally, two separate free layers 512, 508 may be formed on the resistive layer 506. Each free layer is connected to a different electrode so that each free layer can be set or read separately.

For example, the first free layer 508 may have its magnetic moment set to oppose the magnetic moment of the reference layer 504, thus causing a high resistive state between the first top electrode 510 and the bottom electrode 502. Additionally, the second free layer 512 may have its magnetic moment in the same direction as the magnetic moment of the free layer. This will allow for the tunneling of electrons through the resistive layer between the second free layer 512 and the reference layer 504. Thus, there will be a relatively low resistive state between the second top electrode 514 and the bottom electrode 502. While only two free layers are shown in FIG. 5A, various embodiments of principles described herein may include more than two free layers for each reference layer.

Figure 5B:
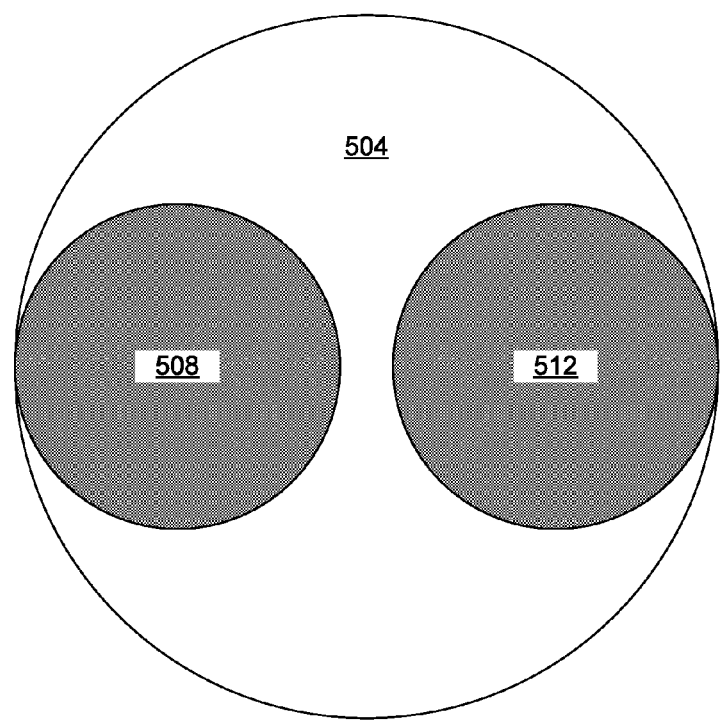
FIG. 5B is a diagram showing an illustrative top view of an MTJ device with multiple free layers, according to one example of principles described herein.

FIG. 5B is a diagram showing an illustrative top view of an MTJ device with multiple free layers. The electrodes are not shown in this view. The first free layer 508 and the second free layer 512 can be seen in comparison to the reference layer 504. Such a configuration may be done according to various design purposes to achieve particular memory module densities.

Figure 6:
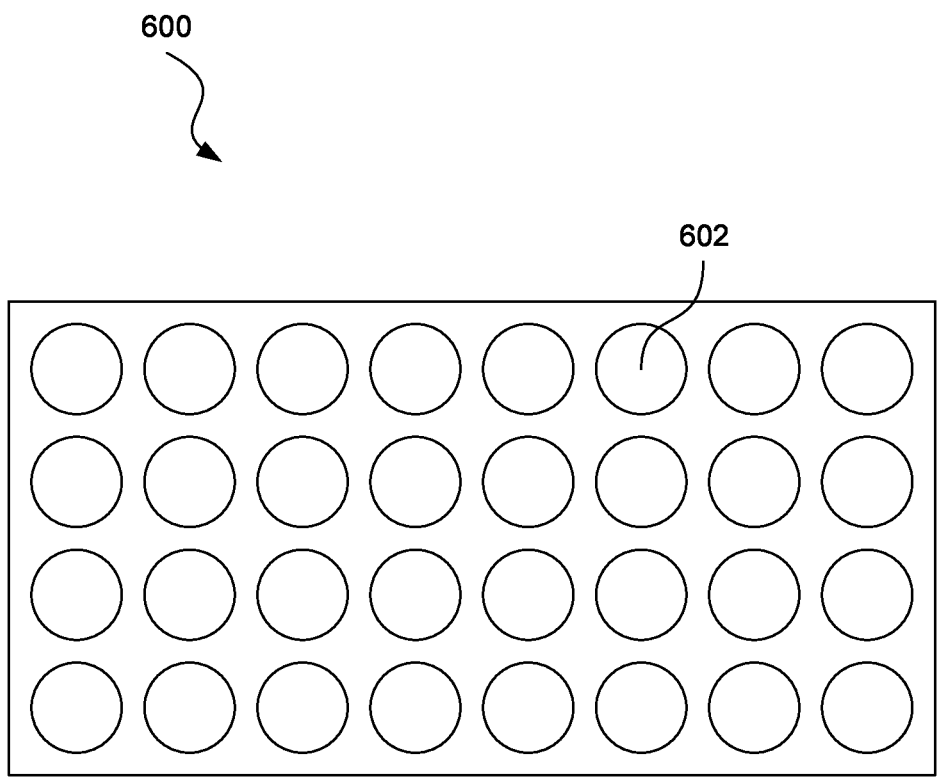
FIG. 6 is a diagram showing an illustrative memory module, according to one example of principles described herein.

FIG. 6 is a diagram showing an illustrative memory module 600. According to certain illustrative examples, the memory module 600 includes a number of MTJ cells 602. Each MTJ cell 602 may include one or more free layers and may thus store one or more bits of data accordingly. As mentioned above, the density of the memory module 600 may depend on the size of the reference layers for each cell. The density of the memory module 600 may also depend on the number of free layers per reference layer. The memory module illustrated in FIG. 6 illustrates only 32 MTJ cells 602. Nevertheless, a practical implementation of the principles described herein may include a much larger number of MTJ cells within a given memory module 600.

Figure 7:
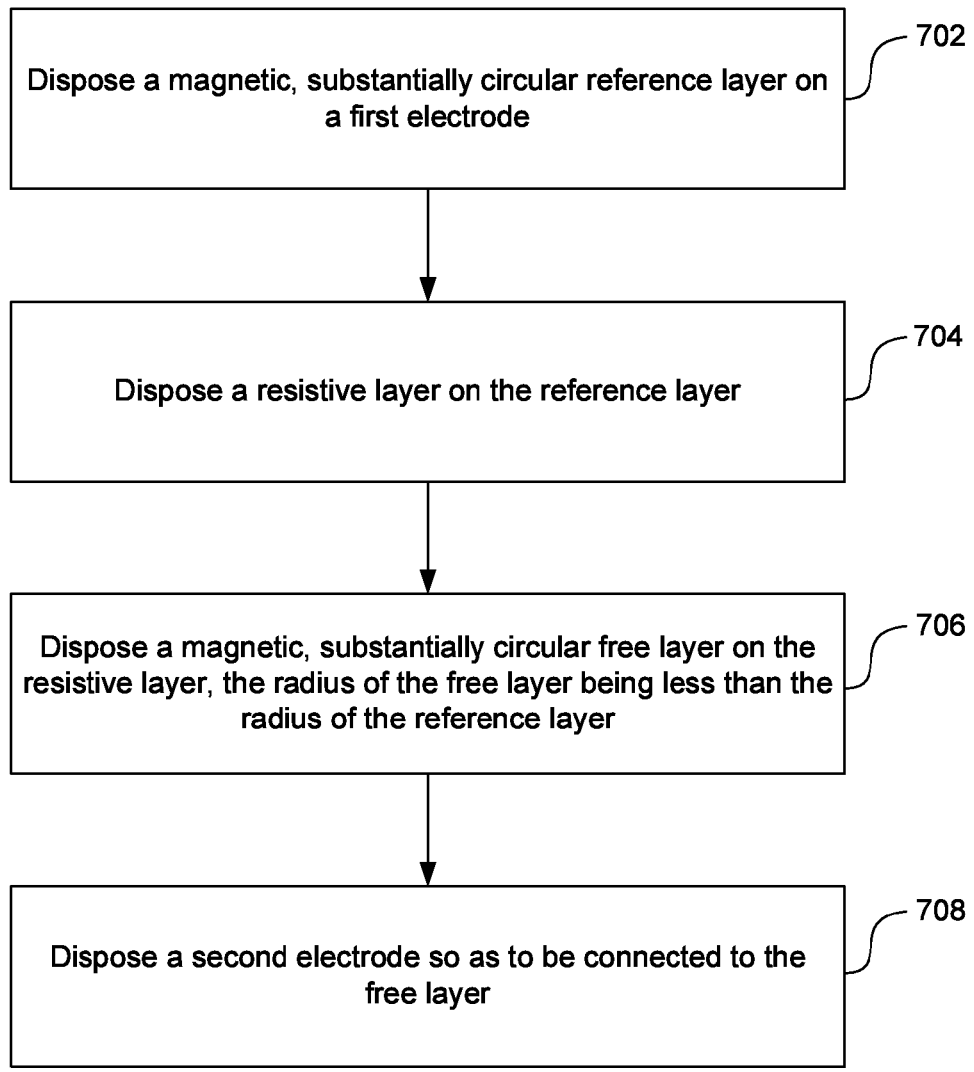
FIG. 7 is a flowchart showing an illustrative method for forming an MTJ device, according to one example of principles described herein.

FIG. 7 is a flowchart showing an illustrative method for forming an MTJ device. According to certain illustrative examples, the method includes disposing 702 a magnetic, substantially circular reference layer on a first electrode, disposing 704 a resistive layer onto the reference layer, disposing 706 a magnetic, substantially circular free layer on the resistive layer, and disposing 708 a second electrode so as to be connected to the free layer. The radius of the free layer is less than a radius of the reference layer.

According to certain illustrative examples, a magnetoresistive tunnel junction includes a magnetic reference layer disposed between a first electrode and a resistive layer. The junction also includes a magnetic free layer disposed between the resistive layer and a second electrode. The surface area of the free layer is less than the surface area of the reference layer.

According to certain illustrative examples, A memory module comprising an array of MTJ cells. Each MTJ cell includes a resistive layer disposed between a circular magnetic reference layer and a circular magnetic free layer, and a first electrode in connection with the reference layer and a second electrode in connection with the free layer. The radius of the free layer is less than the radius of the reference layer.

According to certain illustrative examples, the method includes disposing a magnetic, substantially circular reference layer on a first electrode, disposing a resistive layer onto the reference layer, disposing a magnetic, substantially circular free layer on the resistive layer, and disposing a second electrode so as to be connected to the free layer. The radius of the free layer is less than a radius of the reference layer.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A Magnetoresistive Tunnel Junction (MTJ) device comprising:

a magnetic reference layer disposed between a first electrode and a resistive layer and having a first magnetic vertical core; and
a magnetic free layer disposed between the resistive layer and a second electrode and having a second magnetic vertical core;
wherein, a surface area of the magnetic free layer is less than a surface area of the magnetic reference layer and an entirety of the magnetic free layer is directly above the magnetic reference layer; and
wherein a center of the magnetic free layer is at an offset distance from a center of the magnetic reference layer such that the first magnetic vertical core does not overlap with the second magnetic vertical core.

2. The device of claim 1, wherein the magnetic reference layer and the magnetic free layer are substantially circular in shape.

3. The device of claim 2, wherein a radius of the magnetic free layer is sufficiently smaller than a radius of the magnetic reference layer so as to reduce a dipole interaction between the magnetic free layer and the magnetic reference layer to a predetermined level.

4. The device of claim 2, wherein a radius of the magnetic reference layer is greater than five times a radius of the magnetic free layer divided by three.

5. The device of claim 1, wherein the offset distance is greater than or equal to one fourth the radius of the magnetic reference layer plus one fourth the radius of the magnetic free layer.

6. The device of claim 1, further comprising at least one additional and separate magnetic free layer adjacent to the resistive layer.

7. The device of claim 6, wherein each magnetic free layer is used to store a digital value based on resistance levels in the resistive layer between that magnetic free layer and the magnetic reference layer.

8. A memory module comprising an array of Magnetoresistive Tunnel Junction (MTJ) cells, each MTJ cell comprising:
a resistive layer disposed between a magnetic reference layer and a magnetic free layer, the magnetic reference layer and the magnetic free layer being circular;
at least one additional and separate magnetic free layer directly above the magnetic reference layer;
a first electrode in connection with the magnetic reference layer; and
a second electrode in connection with the magnetic free layer;
wherein, the magnetic reference layer has a first magnetic vertical core, the magnetic free layer has a second magnetic vertical core, and the first magnetic vertical core and the second magnetic vertical core are not concentric, and an entirety of the magnetic free layer is directly above the magnetic reference layer.

9. The module of claim 8, wherein a radius of the magnetic free layer is sufficiently smaller than a radius of the magnetic reference layer so as to reduce a dipole interaction between the magnetic free layer and the magnetic reference layer to a predetermined level.

10. The module of claim 8, wherein a radius of the magnetic reference layer is greater than five times a radius of the magnetic free layer divided by three.

11. The module of claim 8, wherein a center of the magnetic free layer is offset a distance from a center of the magnetic reference layer such that the first magnetic vertical core does not overlap with the second magnetic vertical core.

12. The module of claim 11, wherein the offset distance is greater than or equal to one fourth the radius of the magnetic reference layer plus one fourth the radius of the magnetic free layer.

13. The module of claim 8, wherein a radius of the magnetic reference layer is set to be as small as possible without having a dipole interaction between the magnetic free layer and the magnetic reference layer rise above a predetermined level.

14. The module of claim 8, wherein each additional magnetic free layer is connected to a different electrode.

15. The module of claim 8, wherein each magnetic free layer is used to store a digital value based on resistance levels in the resistive layer between that magnetic free layer and the reference layer.

16. A Magnetoresistive Tunnel Junction (MTJ) device, comprising:
a substrate with a first electrode;
a magnetic reference layer on the first electrode, the magnetic reference layer being substantially circular;
a resistive layer on the magnetic reference layer;
a magnetic free layer being substantially circular, the magnetic free layer positioned on the resistive layer such that an entirety of the magnetic free layer is directly above the magnetic reference layer; and
a second electrode connected to the magnetic free layer;
wherein the magnetic reference layer produces a first magnetic core in a first direction, and the magnetic free layer produces a second magnetic core in a second direction, different from the first direction, and the first magnetic core does not overlap with the second magnetic core.

17. The MTJ device of claim 16, wherein a radius of the magnetic reference layer is greater than five times a radius of the magnetic free layer divided by three.

18. The MTJ device of claim 16, wherein a center of the magnetic free layer is offset a distance from a center of the magnetic reference layer such that and the offset distance is greater than or equal to one fourth a radius of the magnetic reference layer plus one fourth a radius of the magnetic free layer.

* * * * *